United States Patent

Chang et al.

[11] Patent Number: 6,096,603
[45] Date of Patent: Aug. 1, 2000

[54] METHOD OF FABRICATING A SPLIT GATE STRUCTURE OF A FLASH MEMORY

[75] Inventors: Ko-Hsing Chang, Hsinchu; Kuo-Hao Juo, Miaoli Hsien, both of Taiwan

[73] Assignee: Worldwide Semiconductor Manufacturing Corp., Hsinchu, Taiwan

[21] Appl. No.: 09/099,975

[22] Filed: Jun. 19, 1998

[30] Foreign Application Priority Data

Feb. 16, 1998 [TW] Taiwan ................................ 87102081

[51] Int. Cl.⁷ ............................................. H01L 21/8247
[52] U.S. Cl. ............................................ 438/258; 438/266
[58] Field of Search .................................... 438/258, 264, 438/266, 267, 593, 594

[56] References Cited

U.S. PATENT DOCUMENTS

| | | | |
|---|---|---|---|
| 5,656,527 | 8/1997 | Choi et al. | 438/258 |
| 5,856,223 | 1/1999 | Wang | 438/266 |

*Primary Examiner*—Chandra Chaudhari
*Attorney, Agent, or Firm*—Thomas, Kayden, Horstemeyer & Risley

[57] ABSTRACT

On a substrate, there is at least a first split gate and a second split gate. A dielectric layer is then formed on the substrate to cover the first split gate and the second split gate. The dielectric layer is patterned so that the dielectric layer covers at least a portion of the first split gate, a portion of the second split gate and a common source region between the first split gate and the second split gate. A polysilicon layer is formed on the dielectric layer. The polysilicon layer is then patterned.

23 Claims, 6 Drawing Sheets

METHOD OF FABRICATING A SPLIT GATE STRUCTURE OF A FLASH MEMORY

CROSS-REFERENCE TO RELATED APPLICATION

This application claims the priority benefit of Taiwan application serial no. 87102081, filed Feb. 16, 1998, the full disclosure of which is incorporated herein by reference.

BACKGROUND OF THE INVENTION

1. Field of the Invention

This invention relates to a method of fabricating a flash memory, and more particularly to a method of fabricating a split gate structure of a flash memory.

2. Description of Related Art

A nonvolatile memory is currently applied in electric devices such as for storing structure data, program data and other data needed to be repeatedly read and written. Within the catalog of a programmable nonvolatile memory, an erasable programmable read-only memory (EPROM) and an electrically erasable programmable read-only memory (EEPROM) are now of the highest interest. Generally, one flash memory includes two gates, wherein a floating gate made of polysilicon is for charge storing and a control gate for controlling data access. The floating gate is posited beneath the control gate and is usually at the status of "floating", without being coupled to any wiring lines. The control gate is coupled to a word line.

The flash memory technology is becoming technology of choice among other memory technologies, due to its capability to replace magnetic disk media. Split-gate source-side injection cell has very high programming efficiency and very low write currents. The key elements of the high injection efficiency cell consist of a weakly-on and a highly-on region along the conduction channel. Large potential drop across the narrow region near the source side of floating gate creates a large sum of hot-electrons. Mostly, the split-gate source-side injection cells suffer from the high resistance problems associated with the narrowly formed below-feature-size "sidewall-like" select gate or exhibit over-erase problems.

Recently, to overcome the over-erase problem, a high density triple poly split-gate source-side-injection cell is disclosed in "A novel high density contactless flash memory array using split-gate source-side injection cell foe 5V-only applications" in Symposium on VLSI Technology, 1994 by Y. Ma et al. Referring to FIG. 1, a flash memory cell is on a p-type substrate 10, having tunnel oxide 11, a floating gate 12 and a control gate 13, both of which are made of polysilicon. The floating gate 12 is formed beneath the control gate 13. After the formation of both of the floating gate 12 and the control gate 13, impurities are implanted into the substrate 10 to form the source/drain regions 14, 15. Then, a polysilicon layer is further formed above to form a select gate 16.

The select-gate controls the weakly-on region during programming and prevents unselected cells from conduction in program and read modes. The select-gate runs along the channel direction. This eliminates the need of below-feature-size poly, reduces select-gate delay and improves the speed over the sidewall type select-gate cells. The use of a select-gate allows the cell to operate in depletion mode.

However, as shown in FIG. 1, the distance between the two separated gates is small because the two separated gates share a common source/drain. Consequently, as depositing the polysilicon layer for the selected gate, poor step coverage even a void may occur, which influences the conductive quality of the polysilicon layer. Moreover, different arrays of the selected gates have different levels, which tend to occur short circuit.

SUMMARY OF THE INVENTION

It is therefore an objective of the present invention to provide a method of fabricating a split gate structure of a flash memory to achieve small cell size, high programming efficiency, high cell current with no over-erase current. Moreover, depositing a dielectric layer to planarize the uneven surface and therefore increase the deposition quality so that the process is simplified and the cell is successfully sized down.

It is another an objective of the present invention to provide a method of fabricating a split gate structure of a flash memory, wherein on a substrate, there is at least a first split gate and a second split gate. A dielectric layer is then formed on the substrate to cover the first split gate and the second split gate. The dielectric layer is patterned so that the dielectric layer covers at least a portion of the first split gate, a portion of the second split gate and a common source region between the first split gate and the second split gate. A polysilicon layer is formed on the dielectric layer. The polysilicon layer is then patterned.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

EXAMPLE 1

Figure 1:
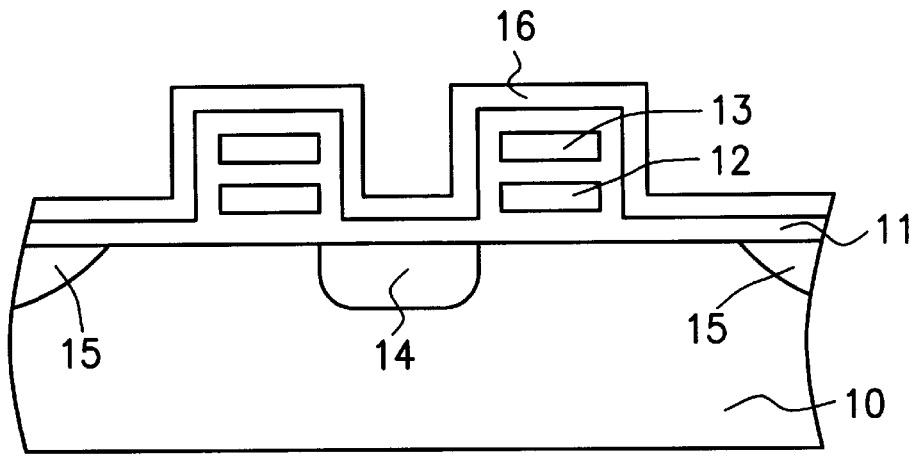
FIG. 1 is a cross-sectional view showing the split gate structure of a conventional flash memory.
Figure 2A:
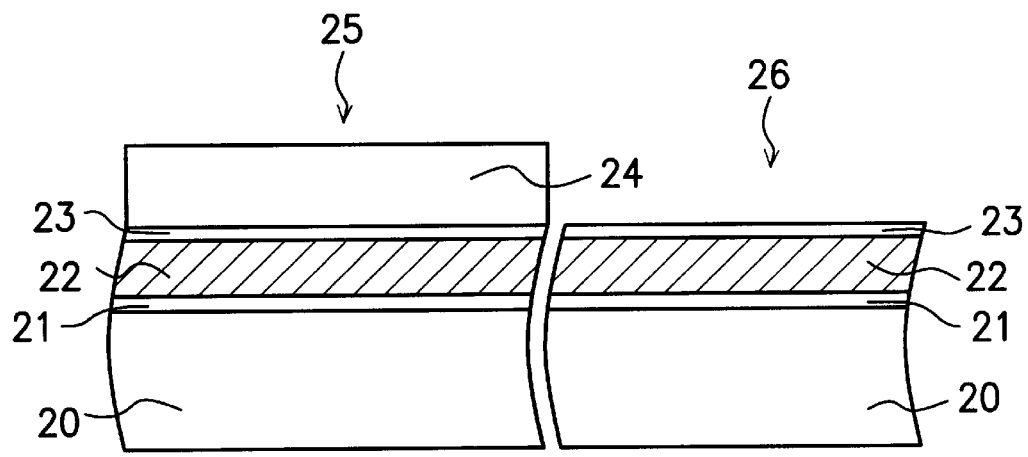
FIG. 2A to FIG. 2F are cross-sectional views showing the process flow of fabricating the split gate structure of a flash memory according to a preferred embodiment of the invention.

Referring to FIG.2A, on a semiconductor substrate 20, a high quality gate oxide layer is formed to be a tunnel oxide layer 21. The tunnel oxide layer 21 can be formed by, for example, thermal oxidation, to have a thickness of about less than 100 Å. Next, a first polysilicon layer 22 is formed on the tunnel oxide layer 21, using, for example, low pressure chemical vapor deposition (LPCVD). A dielectric layer 23 is then formed on the surface of the first polysilicon layer 22. The dielectric layer 23 can be a oxide-nitride-oxide (ONO) dielectric layer and have a thickness of about 220 Å. Then, a photoresist layer 24 is then formed on a portion of the surface of the dielectric layer 23. One portion of the substrate covered by the photoresist 24 is the first region 25 for forming a flash memory. Another portion of the substrate not covered by the photoresist 24 is the second region 26 for forming a metal-oxide-semiconductor (MOS) device.

Figure 2B:
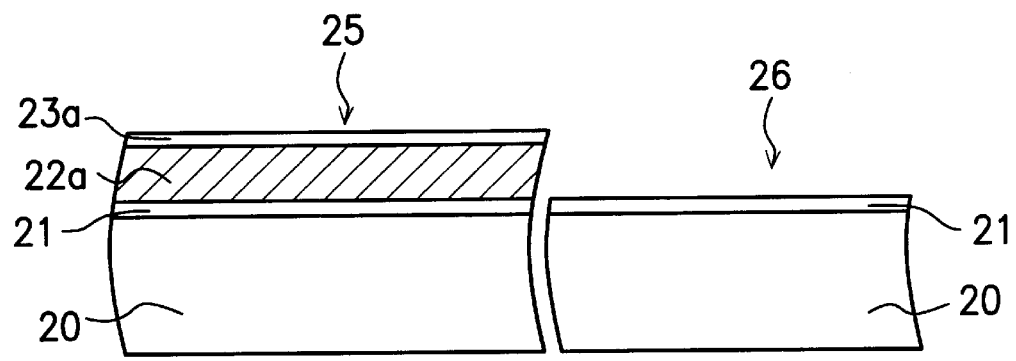

Next, using the photolithography and etching technique, the dielectric layer 23 and the first polysilicon layer 22 over the second region 26 are etched successively to expose the tunnel oxide layer 21 of the second region 26. This etching process is preferably a dry etching. After removal of the photoresist layer 24, there are a dielectric layer 23a, a first polysilicon layer 22a, the tunnel oxide layer 21 and the substrate 20 over the first region 25. However, only the tunnel oxide layer 21 and the substrate 20 are left over the second region 26 and the tunnel oxide layer 21 is exposed, as shown in FIG. 2B.

Figure 2C:
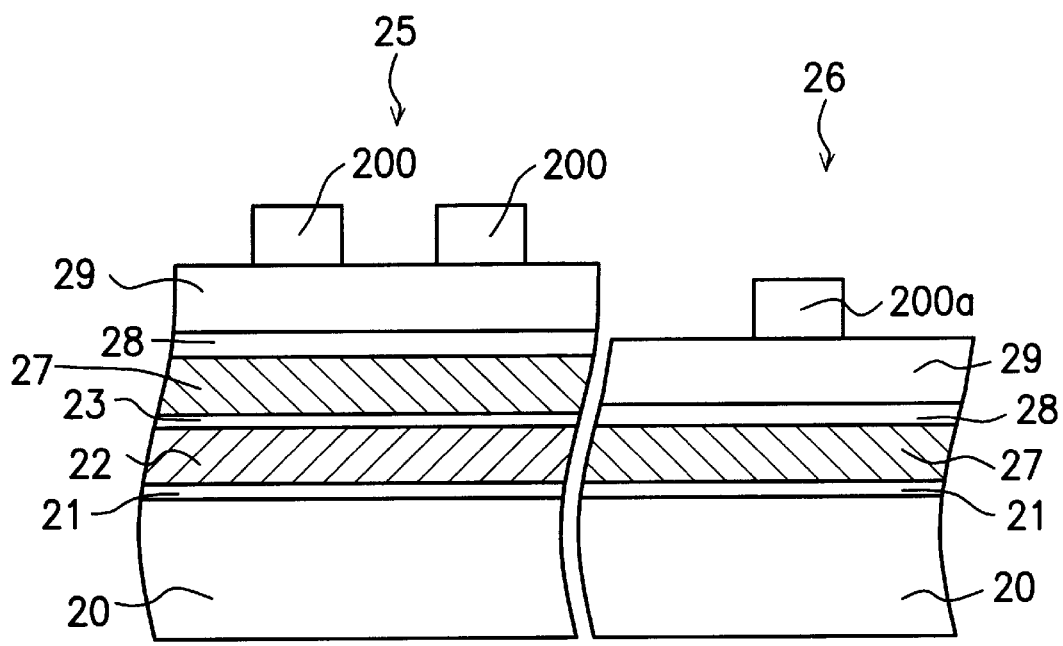

Referring next to FIG. 2C, a second polysilicon layer 27 is formed on the surface of the dielectric layer 23a on the first region and the exposed tunnel oxide layer 21 on the second region. Further more, a metal silicide layer 28 with better conductivity than polysilicon on the second polysilicon layer 27. The metal silicide layer 28 is preferably a tungsten silicide layer. Then, a mask layer 29 for etching protection is formed on the metal silicide layer 28. The mask layer 29 can be a silicon nitride layer. Next, photoresist layers 200, 200a are formed on the mask layer 29 over the first region and the second region, respectively. The photoresist layer 200 is used for patterning the first region to form a first split gate and a second split gate of the flash memory. The photoresist layer 200a is used for patterning the second region to form a gate region of the MOS device.

Figure 2D:
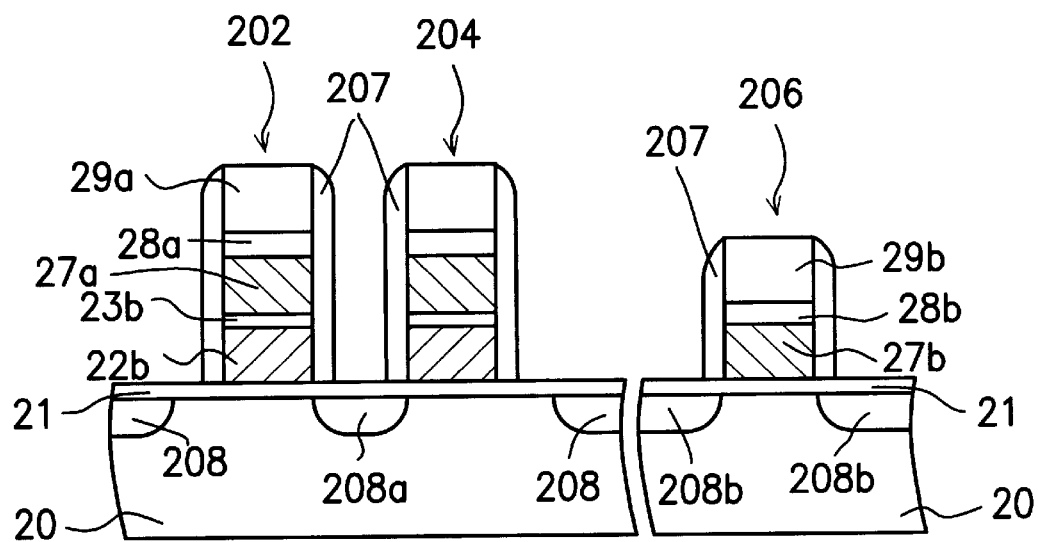

Then, referring to FIG. 2D, after patterning the first split gate and the second split gate, a portion of the mask layer, tungsten silicide, the polysilicon layer, the dielectric layer and the second polysilicon layer on the first region to form the first split gate 202 and the second split gate 204. The first split gate 202 and the second split gate 204 is formed of a mask layer 29a, tungsten silicide 28a, a second polysilicon layer 27a, a dielectric layer 23b and a second polysilicon layer 22b. The first polysilicon layer serves as the floating gate of the split gate. The second polysilicon layer serves as the control gate. The gate on the second region is also formed by patterning the mask layer, tungsten silicide and the second polysilicon layer. The gate 206 includes the mask layer 29b, tungsten silicide 28d, and a second polysilicon layer 27b.

Next, a spacer 207 is formed on the sidewalls of the first split gate 202, the second split gate 204 and the gate 206. For example, after depositing a silicon nitride layer, the silicon nitride layer is then etched back. An ion implantation step is then performed on the semiconductor substrate 20 so that first source/drain regions 208, 208a on the first region, second source regions 208b on the second region are formed. The first split gate 202 on the first region and the second split gate 204 share a common source region 208a.

Figure 2E:
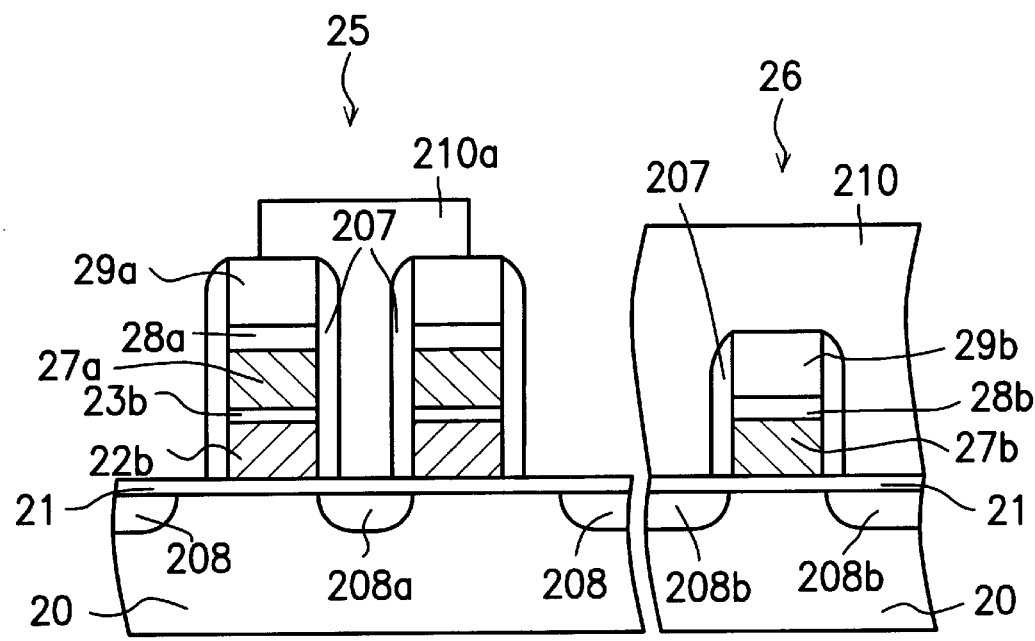

Referring to FIG. 2E, a dielectric layer 210 is formed over the split gates on the first region and the gate on the second region. The dielectric layer 210 can be formed by chemical vapor deposition (CVD). The dielectric layer 210 preferably at least covers the first split gate and the second split gate and then a chemical mechanical polishing technique (CMP) is performed to planarize the surface of the dielectric layer 210. Next, the dielectric layer on the first region is patterned by photolithography and etching steps so that a portion of the dielectric layer on the first region is removed and the remained dielectric layer 210a covers at least a portion of the first split gate 202 and a portion of the second split gate 204 and covers the common source region 208a between the first split gate and the second split gate.

Figure 2F:
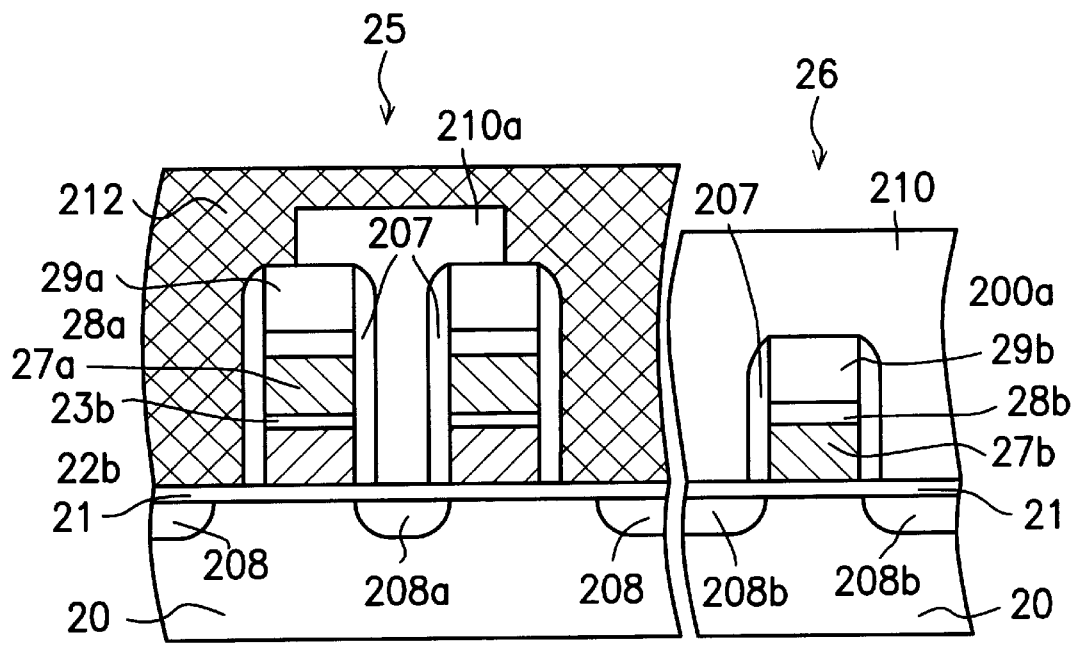

Then, a third polysilicon layer is formed on the dielectric layer. The third polysilicon layer is then patterned so that the third polysilicon layer on the second region is removed. The third polysilicon layer 212 remaining on the surface of the first region serves as the select gate of the flash memory, shown in FIG. 2F, the thickness of the third polysilicon layer is about 2000 to 5000 Å.

In the present example, the first polysilicon gate serves as the floating gate of the split gate of the flash memory, the second polysilicon gate serves as the control gate of the split gate and the gate of the MOS device, and, further more, the third polysilicon layer and the tungsten silicide serve as the select gate of the split gate.

EXAMPLE 2

Figure 3A:
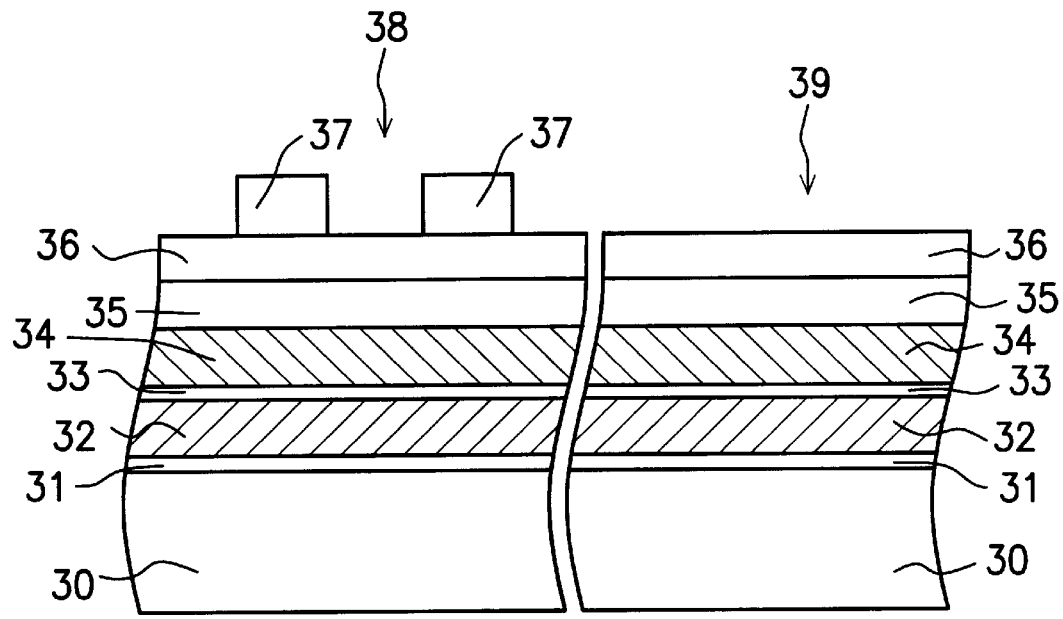
FIG. 3A to FIG. 3F are cross-sectional views showing the process flow of fabricating the split gate structure of a flash memory according to another preferred embodiment of the invention.

Referring to FIG. 3A, on a substrate 30, a tunnel oxide layer 31, a first polysilicon layer 32, a dielectric layer 33, a second polysilicon layer 34, a tungsten silicide layer 35 and a mask layer 36 are formed successively. The dielectric layer 33 and the mask layer 36 can be, for example, a silicon oxide/silicon nitride/silicon oxide layer and a silicon nitride layer. Next, on the first region 38, which is desired for forming the flash memory, a photoresist layer 37 is formed to pattern split gates.

Figure 3B:
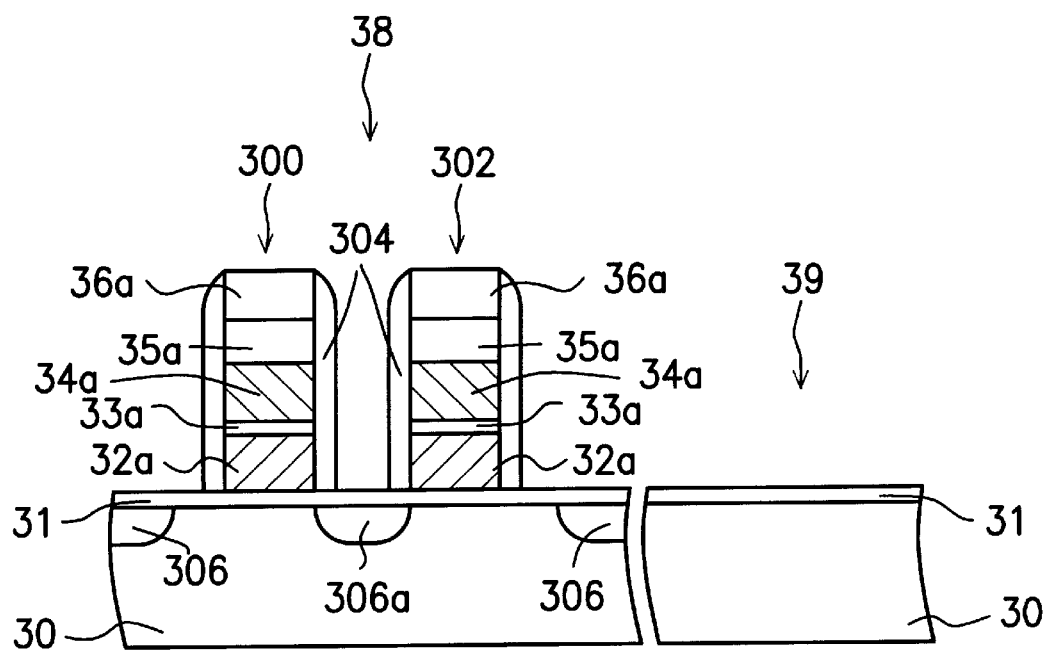

Next, the mask layer, the tungsten silicide layer, the second polysilicon layer, the dielectric layer and the first polysilicon layer, which are on the first region 38 but not covered by the photoresist layer are etched to remove. Consequently, the remaining mask layer 36a, tungsten silicide layer 35a, second polysilicon layer 34a, dielectric layer 33a and first polysilicon layer 32a are on the first region. The first polysilicon gate serves as the floating gate of the split gate and the second polysilicon gate serves as the control gate. Almost simultaneously, the mask layer, the tungsten silicide layer, the second polysilicon layer, the dielectric layer and the first polysilicon layer on the second region 39 for the MOS device are removed to expose the tunnel oxide layer 31 on the surface of the second region 39, as shown in FIG. 3B. Next, a spacer 304 is formed on the sidewalls of the first split gate 300, and the second split gate 302. For example, after depositing a silicon nitride layer, the silicon nitride layer is then etched back. An ion implantation step is then performed on the semiconductor substrate 20 so that first source/drain regions 306, 306a on the first region are formed. The first split gate 300 and the second split gate 302 share a common source region 306a.

Figure 3C:
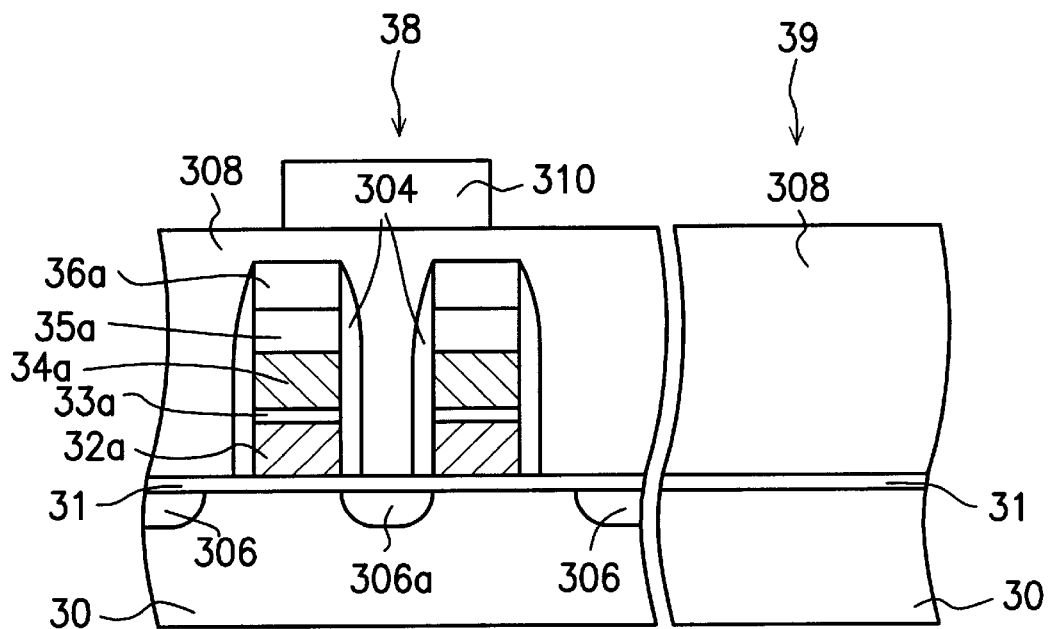
Figure 3D:
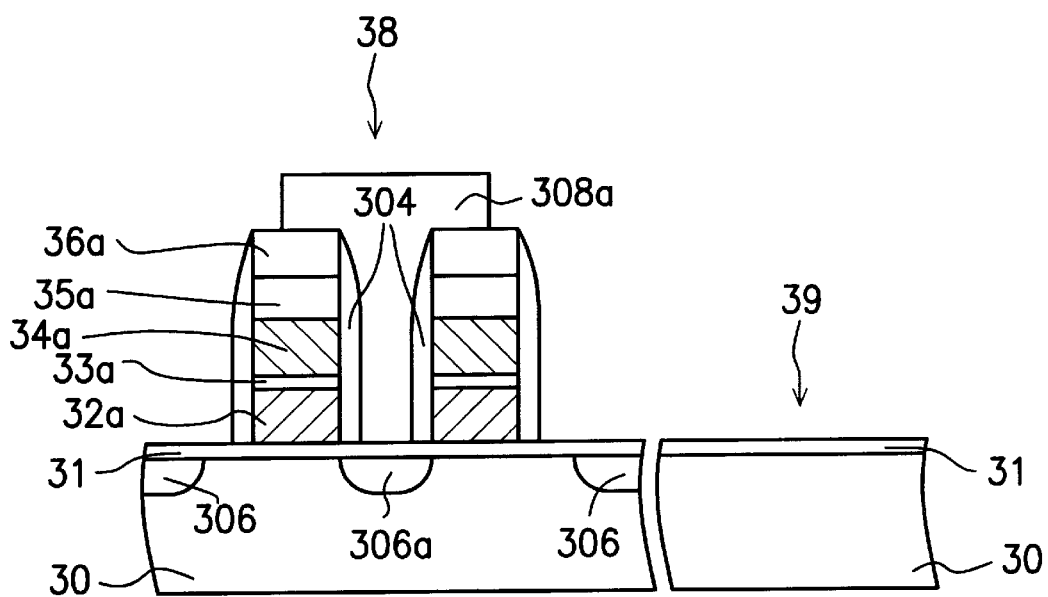
Figure 3E:
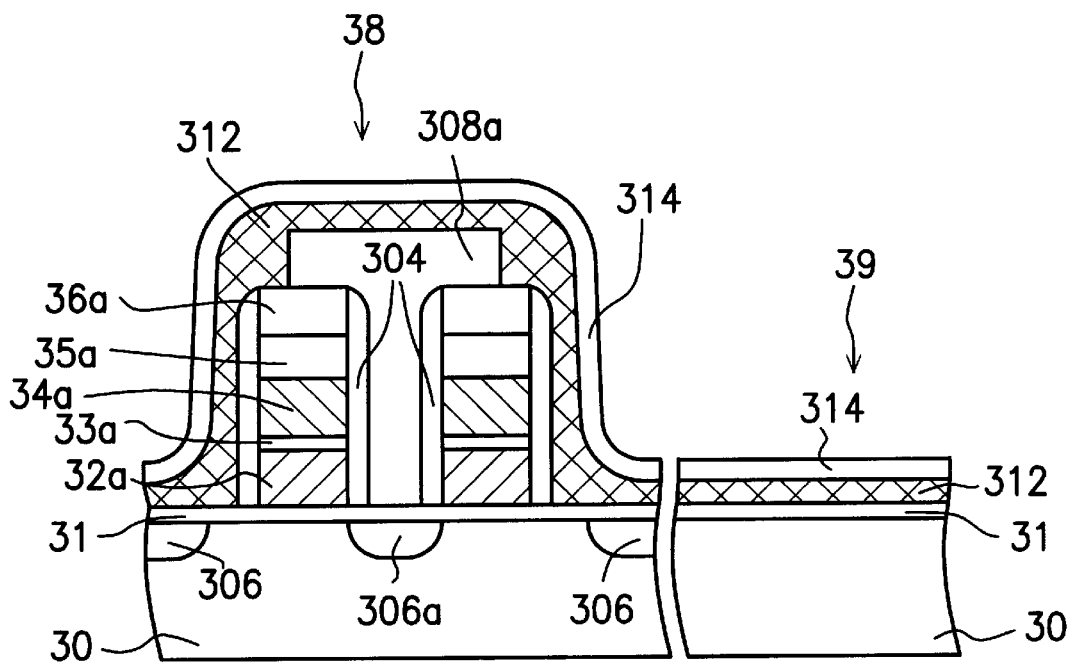

Referring to FIG. 3C, a dielectric layer 308 is then formed to cover the split gate on the first region and the exposed tunnel oxide layer 31 on the second region. The dielectric layer 308 can be formed, for example, by CVD. The dielectric layer 308 preferably at least covers the first split gate and the second split gate and then a CMP technique is performed to planarize the surface of the dielectric layer 308. Next, the dielectric layer 308 on the first region is patterned by photolithography and etching steps so that a portion of the dielectric layer on the first region is removed and the remained dielectric layer 308a covers at least a portion of the first split gate and a portion of the second split gate and covers the common source region between the first split gate and the second split gate. Simultaneously, the dielectric layer on the second region is removed to expose the tunnel oxide layer 31 on the second region, as shown in FIG. 3D.

Figure 3F:
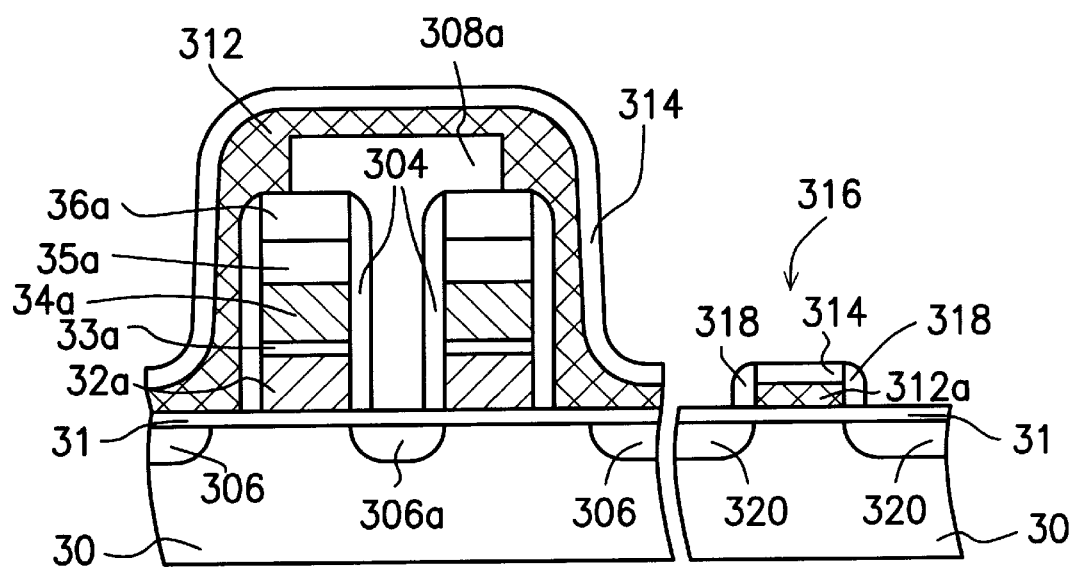

Then, a third polysilicon layer 312 is formed on the dielectric layer 308a and the exposed tunnel oxide layer 31 on the second region. A tungsten silicide layer 314 is then formed on the third polysilicon layer. The third polysilicon layer 312 and the tungsten silicide layer 314 together serve as the select gate of the flash memory. Next, as shown in FIG. 3F, the third polysilicon layer and the tungsten silicide layer on the second region are patterned to form a gate 316 of the MOS device. The gate 316 of the MOS device includes the third polysilicon layer 312a and the tungsten silicide 314a. A spacer 318 is then formed on the sidewall of the gate 316 and an ion implantation process is performed to form second source/drain regions 320 on the second region of the substrate.

Therefore, it is clear that the first polysilicon layer serves as the floating gate of the split gate of the flash memory, the second polysilicon layer and the tungsten silicide layer serve as the control gate of the split gate and the third polysilicon layer and the tungsten silicide together serve as the select gate of split gate and the gate of the MOS device.

According to the invention, by first depositing a dielectric layer and then performing a CMP process, the uneven surface of the split gates is planarized. Consequently, the quality of select gate deposition and etching is improved. Besides of the advantage of simplification of the process, the invention further provides a method of fabricating a split gate structure of a flash memory to achieve small cell size, high programming efficiency, high cell current with no over-erase current.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating a split gate structure of a flash memory, wherein on a substrate, there is at least a first split gate and a second split gate, comprising:

forming a dielectric layer on the substrate, wherein the dielectric layer covers the first split gate and the second split gate;

patterning the dielectric layer so that the dielectric layer covers at least a portion of the split gate, a portion of the second split gate and a common source region between the first split gate and the second split gate;

forming a polysilicon layer on the dielectric layer;

performing a chemical mechanical polish process to planarize the dielectric layer; and patterning the polysilicon layer.

2. A method of claim 1, wherein the polysilicon layer serves as a select gate of the flash memory.

3. A method of fabricating a split gate structure of a flash memory, wherein on a substrate, at least a first region and a second region are formed, comprising:

forming a tunnel oxide layer, a first polysilicon layer and a dielectric layer on the substrate successively;

forming a photoresist layer, wherein the photoresist layer covers a first portion of the dielectric layer on the first region and a second portion of the dielectric layer and the first polysilicon layer are not covered by the photoresist layer but exposed;

removing the exposed second portion of the dielectric layer and the exposed first polysilicon layer to expose the tunnel oxide layer on the second region;

forming a second polysilicon layer and a mask layer on the substrate successively;

patterning the first region to remove a portion of the mask layer, a portion of the second polysilicon layer, a portion of the dielectric layer and a portion of the first polysilicon layer to form a first split gate and a second split gate and patterning the second region to remove another portion of the mask layer and another portion of the second polysilicon layer to forming a first gate;

forming spacers on sidewalls of the first split gate, the second split gate and the first gate; performing an ion implantation process to form a first source/drain region and a second source/drain region on the first region and the second region, respectively, wherein the first split gate and the second split gate share a common source region;

forming a dielectric layer and patterning the dielectric layer to remove a portion of the dielectric layer on the first region, wherein the dielectric layer fills a gap between the first split gate and the second split gate; and forming a third polysilicon layer on the substrate and patterning the third polysilicon layer to remove a portion of the third polysilicon layer on the second region.

4. A method of claim 3, wherein said step of forming the second polysilicon layer and the mask layer further comprises a step of forming a tungsten silicide layer on the surface of the second polysilicon layer.

5. A method of claim 3, wherein after said step of forming the dielectric layer, a chemical mechanical polishing process is further performed to planarize the dielectric layer.

6. A method of claim 3, wherein the dielectric layer comprises a silicon oxide/silicon nitride/silicon oxide layer.

7. A method of claim 3, wherein the mask layer comprises silicon nitride.

8. A method of claim 3, wherein the spacer comprises silicon nitride.

9. A method of claim 3, wherein the gate on the second region comprises the second polysilicon layer and the mask layer.

10. A method of claim 3, wherein the first polysilicon layer serves as floating gates of the first split gate and the second split gate.

11. A method of claim 3, wherein the second polysilicon layer serves as a control gate of the flash memory.

12. A method of claim 3, wherein the third polysilicon layer serves as a select gate of the flash memory.

13. A method of fabricating a split gate structure of a flash memory on a substrate, wherein the substrate has a first region and a second region, comprising:

forming a tunnel oxide layer, a first polysilicon layer, a dielectric layer, a second polysilicon layer and a mask layer successively on the substrate;

patterning the first region so that the mask layer, the second polysilicon layer, the dielectric layer and the first polysilicon layer on the first region are partially removed to form a first split gate and a second split gate and the mask layer, the second polysilicon layer, the dielectric layer and the first polysilicon layer on the second region are removed to expose the tunnel oxide layer on the second region;

forming a first spacer and a second spacer on sidewalls of the first split gate and the second split gate, respectively;

performing a second ion implantation process to form first source/drain regions on the first region, wherein the first split gate and the second split gate share a common source region;

forming a dielectric layer on the substrate and patterning the dielectric layer to remove a portion of the dielectric layer on the first region and the dielectric layer on the second region; forming a third polysilicon layer on the dielectric layer and patterning the third polysilicon layer on the second region to form a gate;

forming a third spacer at a sidewall of the gate; and performing a second ion implantation process to form second source/drain regions on the second region.

14. A method of claim 13, wherein, in said step of forming the tunnel oxide layer, the first polysilicon layer, the dielectric layer, the second polysilicon layer and the mask layer successively on the substrate, a first tungsten silicide layer is further formed on the second polysilicon layer.

15. A method of claim 13, wherein after said step of forming the dielectric layer, a chemical mechanical polishing process is further performed to planarize the dielectric layer.

16. A method of claim 13, wherein before said step of forming the third spacer on the side wall of the gate, a second tungsten silicide layer is further formed on the third polysilicon layer.

17. A method of claim 13, wherein the dielectric layer comprises a silicon oxide/silicon nitride/silicon oxide layer.

18. A method of claim 13, wherein the mask layer comprises silicon nitride.

19. A method of claim 13, wherein the first, second and third spacers comprise silicon nitride.

20. A method of claim 13, wherein the gate on the second region comprises the third polysilicon layer.

21. A method of claim 13, wherein the first polysilicon layer serves as floating gates of the first split gate and the second split gate.

22. A method of claim 14, wherein the second polysilicon gate and the first tungsten suicide layer serve as a control gate of the flash memory.

23. A method of claim 16, wherein the third polysilicon layer and the second tungsten silicide layer serve as a select gate of the flash memory.

* * * * *